United States Patent
Hsieh et al.

(10) Patent No.: US 9,160,274 B2
(45) Date of Patent: Oct. 13, 2015

(54) FINFET VARACTOR

(71) Applicant: Taiwan Semiconductor Manufacturing Co., Ltd., Hsin-Chu (TW)

(72) Inventors: Hsieh-Hung Hsieh, Taipei (TW); Yi-Hsuan Liu, Hualien (TW); Chewn-Pu Jou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 51 days.

(21) Appl. No.: 14/165,765

(22) Filed: Jan. 28, 2014

(65) Prior Publication Data

US 2015/0214892 A1 Jul. 30, 2015

(51) Int. Cl.
| | |
|---|---|
| *H03L 7/06* | (2006.01) |
| *H03B 5/12* | (2006.01) |
| *H01L 27/06* | (2006.01) |
| *H01L 27/088* | (2006.01) |
| *H01L 27/08* | (2006.01) |
| *H01L 21/8234* | (2006.01) |
| *H03L 7/099* | (2006.01) |

(52) U.S. Cl.
CPC ...... *H03B 5/1275* (2013.01); *H01L 21/823431* (2013.01); *H01L 21/823475* (2013.01); *H01L 27/0629* (2013.01); *H01L 27/0808* (2013.01); *H01L 27/0886* (2013.01); *H03L 7/0995* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 5,625,325 | A | * | 4/1997 | Rotzoll et al. ................... 331/16 |
| 5,739,730 | A | * | 4/1998 | Rotzoll ..................... 331/177 V |
| 5,808,531 | A | * | 9/1998 | Nakano ........................... 334/15 |
| 5,936,474 | A | * | 8/1999 | Rousselin ....................... 331/34 |
| 5,949,291 | A | * | 9/1999 | Newland ......................... 331/18 |
| 6,549,765 | B2 | * | 4/2003 | Welland et al. ............... 455/260 |
| 7,026,883 | B2 | | 4/2006 | Muthali et al. |

(Continued)

OTHER PUBLICATIONS

Dehan, et al. "Characterization, Modeling, and Optimization of FinFET MOS Varactors." IEEE 2007 Topical Meeting on Silicon Monolithic Integrated Circuits in RF Systems. Jan. 10-12, 2007. 5 Pages.

(Continued)

*Primary Examiner* — Adam Houston
(74) *Attorney, Agent, or Firm* — Eschweiler & Associates, LLC

(57) ABSTRACT

The present disclosure relates to a FinFET varactor circuit having one or more control elements that control a relationship between capacitance and voltage of a FinFET MOS varactor without introducing changes to process parameters used in fabrication of the FinFET MOS varactor. In some embodiments, the FinFET varactor circuit has a FinFET MOS varactor with a first terminal connected to a gate terminal of the FinFET MOS varactor and a second terminal connected to connected source and drain terminals of the FinFET MOS varactor. One or more control elements are connected to the first or second terminals of the FinFET MOS varactor and vary one or more operating characteristics of the FinFET MOS varactor. Using the control elements to vary the operating characteristics of the FinFET MOS varactor, allows for the characteristics to be adjusted without making changes to process parameters used in the fabrication of the FinFET MOS varactor.

20 Claims, 5 Drawing Sheets

(56) References Cited

U.S. PATENT DOCUMENTS

| | | | |
|---|---|---|---|
| 7,180,344 B2 * | 2/2007 | Mayer et al. | 327/156 |
| 8,384,248 B2 * | 2/2013 | Kanno | 307/109 |
| 8,610,474 B2 * | 12/2013 | Aryanfar et al. | 327/156 |
| 2005/0046452 A1 * | 3/2005 | Briones | 327/156 |
| 2009/0239350 A1 | 9/2009 | Nowak | |
| 2011/0149464 A1 * | 6/2011 | Takahashi | 361/277 |
| 2011/0292011 A1 * | 12/2011 | Lee | 345/208 |
| 2014/0091868 A1 * | 4/2014 | Ishikawa et al. | 331/107 DP |

OTHER PUBLICATIONS

ITU VLSI Labs Varactors: Literature Search About Varactors. Oct. 10, 2013. 4 Pages.

* cited by examiner

FINFET VARACTOR

BACKGROUND

MOS (metal-oxide-semiconductor) varactors are semiconductor devices that have a capacitance that varies as a function of an applied voltage. Varactors are often used as tuning elements in circuits such as voltage controlled oscillators (VCOs), phase shifters, and phase locked loops (PLLs). For example, by varying a voltage applied to a varactor, the frequency of operation of an associated VCO can be adjusted.

The relationship between an applied voltage and a resulting capacitance is an important characteristic of a varactor. For example, the capacitance ratio, also known as the tunability, is a ratio of the highest and lowest capacitive values ($C_{max}/C_{min}$) that can be achieved by a varactor over a range of applied voltages. The capacitance ratio tells a designer how a capacitance of a varactor changes in response to an applied voltage.

DETAILED DESCRIPTION

Figure 1:
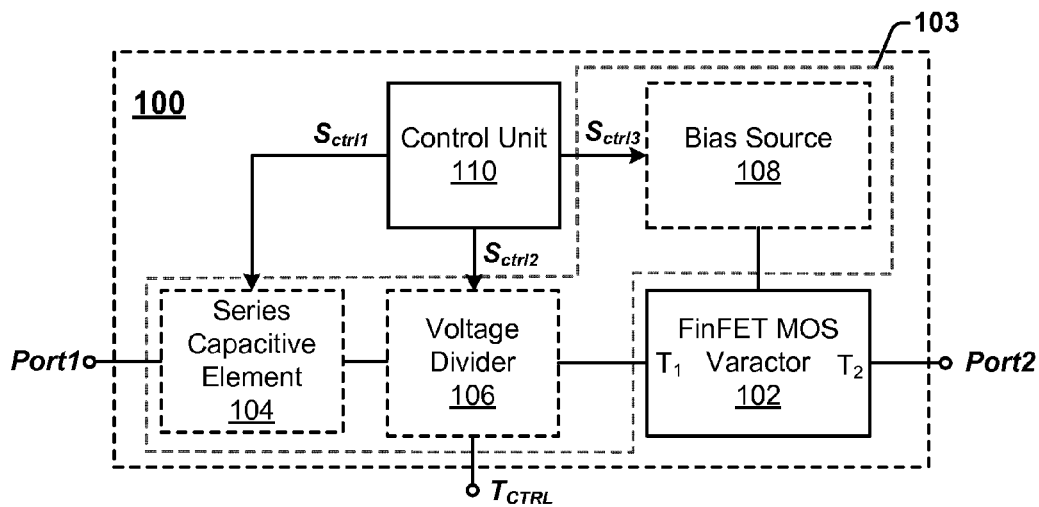
FIG. 1 illustrates some embodiments of a block diagram of a FinFET (field effect transistor) varactor circuit having one or more control elements configured to adjust a relationship between an applied voltage and a resulting capacitance.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FinFET (field effect transistor) devices are becoming commonly used in integrated circuits. FinFET devices have a conductive channel comprising a fin of semiconducting material that rises above a planar substrate as a three-dimensional structure. A gate structure, configured to control the flow of charge carriers within the conductive channel, wraps around the fin of semiconducting material. For example, in a tri-gate FinFET device, the gate structure wraps around three sides of the fin of semiconducting material, thereby forming conductive channels on three sides of the fin.

Because FinFET devices exhibit good analog and RF performance, FinFET devices may potentially be used as MOS varactors in emerging technology nodes (e.g., 16 nm node, etc.). However, due to the tri-gate structure of a FinFET device, a FinFET MOS varactor has a capacitance that is more sensitive to changes in applied voltage than a planar MOS device. This causes a FinFET MOS varactor to have a relatively large change in capacitance in response to an applied voltage (i.e., a relatively steep C-V slope of capacitance vs. voltage). The large change in capacitance in response to an applied voltage allows for the performance of a Fin FET MOS varactor to be more easily degraded by noise.

For example, the steeper C-V slope of a FinFET MOS varactor causes a voltage controlled oscillator (VCO) formed using a FinFET MOS varactor to have a larger VCO gain ($K_{VCO}$) than a VCO formed using a planar MOS varactor. The larger VCO gain will amplify noise coupled to a control node of the VCO, thereby causing the VCO to be sensitive to noise and degrading the phase noise performance. While the C-V slope of a FinFET MOS varactor can be reduced by widening a fin width of a FinFET MOS varactor, widening a fin width drives changes to process parameters used in fabrication of the FinFET MOS varactor, thereby consuming additional effort in fabrication of the FinFET MOS varactor.

Accordingly, some aspects of the present disclosure provide for a FinFET varactor circuit having one or more control elements configured to control a relationship between a capacitance and a voltage of a FinFET MOS varactor without introducing changes to process parameters used in fabrication of the FinFET MOS varactor. In some embodiments, the FinFET varactor circuit comprises a FinFET MOS varactor having a first terminal comprising a gate terminal of the FinFET MOS varactor and a second terminal comprising connected source and drain terminals of the FinFET MOS varactor. One or more control elements are connected to the first and/or second terminals of the FinFET MOS varactor. The one or more control elements are configured to vary one or more operating characteristics of the FinFET MOS varactor when a voltage is applied to the one or more control elements. By varying the one or more operating characteristics of the FinFET MOS varactor using control elements connected to the first and/or second terminals of the FinFET MOS varactor, operating characteristics (e.g., the C-V slope) of a FinFET MOS varactor can be adjusted without making changes to process parameters used in the fabrication of the FinFET MOS varactor.

FIG. 1 illustrates some embodiments of a block diagram of a FinFET (field effect transistor) varactor circuit 100 having one or more control elements 103 configured to adjust one or more operating characteristics (e.g., a relationship between an applied voltage and a resulting capacitance) of the FinFET varactor circuit 100.

The FinFET varactor circuit 100 comprises a FinFET (field effect transistor) MOS varactor 102 connected to one or more control elements 103. The one or more control elements 103 are configured to vary one or more operating characteristics of the FinFET MOS varactor 102. In some embodiments, the one or more operating characteristics may comprise a capacitance of the FinFET MOS varactor 102 and/or a relationship between a voltage applied to the FinFET MOS varactor 102 and a resulting capacitance (e.g., a slope of a C-V curve of the FinFET MOS varactor 102). For example, in some embodiments, the FinFET varactor circuit 100 comprises first and second ports, Port1 and Port2, and a control terminal $T_{CTRL}$. The one or more control elements 103 are configured to vary how a capacitance of the FinFET MOS varactor 102 changes (e.g., a rate of change, a magnitude of change, etc.) when a voltage is applied to one or more of the first and second ports, Port1 and Port2, and/or the control terminal $T_{CTRL}$.

In some embodiments, the FinFET MOS varactor 102 comprises a first terminal $T_1$ and a second terminal $T_2$. In some embodiments, the first terminal $T_1$ is coupled to a gate of the FinFET MOS varactor 102, while the second terminal $T_2$ is coupled to connected source and drain terminals of the FinFET MOS varactor 102. A capacitance of the FinFET MOS varactor 102 varies as a function of a voltage applied across the first and second terminals, $T_1$ and $T_2$. In various embodiments, the one or more control elements 103 may be connected between the first and second ports, Port1 and Port2, and/or the control terminal $T_{CTRL}$ and the first terminal $T_1$ and/or the second terminal $T_2$ of the FinFET MOS varactor 102.

In some embodiments, the one or more control elements 103 may comprise a voltage divider 106 configured to control a voltage applied to the FinFET MOS varactor 102. By controlling a voltage applied to the FinFET MOS varactor 102, the voltage divider 106 can achieve a smoother relationship between a voltage applied to the FinFET varactor circuit 100 and a resulting capacitance (i.e., a smoother C-V curve), thereby mitigating the affect of noise. In other embodiments, the one or more control elements 103 may comprise a series capacitive element 104 connected in series with the FinFET MOS varactor 102. The series capacitive element 104 is configured to adjust a tunability of the FinFET varactor circuit 100, which is a ratio of the highest and lowest capacitive values ($C_{max}/C_{min}$) achievable over a range of applied voltages. In other embodiments, the one or more control elements 103 may comprise a DC bias voltage source 108 connected to the FinFET MOS varactor 102. The DC bias voltage source 108 can change a resulting capacitance of the FinFET varactor circuit 100 achieved by an applied voltage.

In some embodiments, a control unit 110 is configured to control operation of the one or more control elements 103 so as to selectively vary the one or more operating characteristics of the FinFET varactor circuit 100. For example, the control unit 110 may generate a first control signal $S_{ctrl1}$ that controls a capacitive value of the series capacitive element 104. Similarly, the control unit 110 may generate a second control signal $S_{ctrl2}$ that controls operation of the voltage divider 106 and/or a third control signal $S_{ctrl3}$ that controls operation of the DC bias voltage source 108.

Figures 2A, 2B:
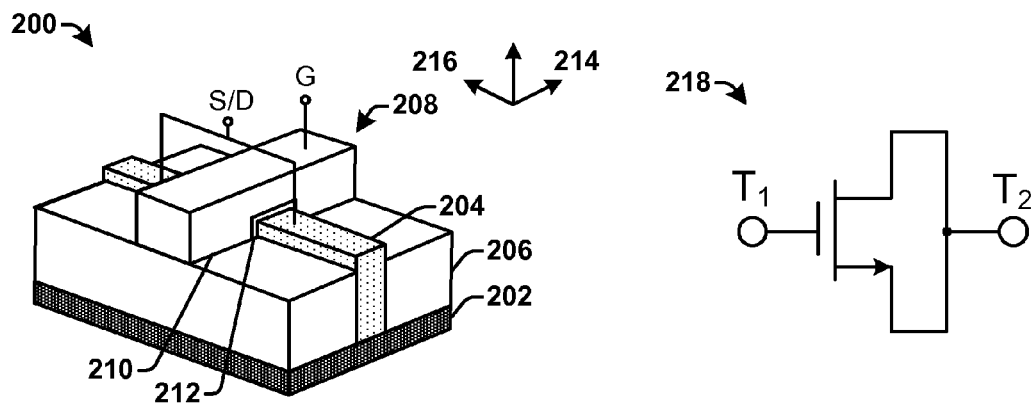
FIGS. 2A-2B illustrate some embodiments of a three-dimensional view of a FinFET (field effect transistor) varactor and a corresponding circuit diagram.

FIG. 2A illustrates some embodiments of a three-dimensional view of a FinFET (field effect transistor) MOS varactor 200.

The FinFET MOS varactor 200 comprises a FinFET transistor device having a three-dimensional fin 204 located over a substrate 202. The three-dimensional fin 204 extends between isolation regions 206 comprising sections of dielectric material along a first direction 214. The three-dimensional fin 204 extends between source and drain regions (not shown) along a second direction 216 perpendicular to the first direction 214. In various embodiments, the substrate 202 may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith. The three-dimensional fin 204 comprises a semiconductor material, which protrudes outward from the substrate 202 as a positive relief.

A gate structure 208, comprising a three-dimensional structure protruding as a second fin, is disposed over the substrate 202 at a position that straddles the three-dimensional fin 204. The gate structure 208 is configured to control the flow of charge carriers in a channel region within the three-dimensional fin 204. The gate structure 208 comprises a gate material layer 210 separated from the three-dimensional fin 204 by a gate dielectric layer 212. In various embodiments, the gate dielectric layer 212 may comprise a silicon dioxide (e.g., $SiO_2$) layer or a high-k dielectric layer. In various embodiments, the gate material layer 210 may comprise a poly-silicon layer or a metal gate layer (e.g., aluminum, aluminum oxide, etc.).

The FinFET MOS varactor 200 comprises a two terminal FinFET device. The first terminal of the FinFET MOS varactor 200 is coupled to the gate structure 208. The second terminal of the FinFET MOS varactor 200 is coupled to the source (S) and drain (D), which are connected together. The two terminal nature of FinFET MOS varactor 200 is illustrated in FIG. 2B, which illustrates some embodiments of a circuit diagram corresponding to FinFET MOS varactor 200.

Figure 3:
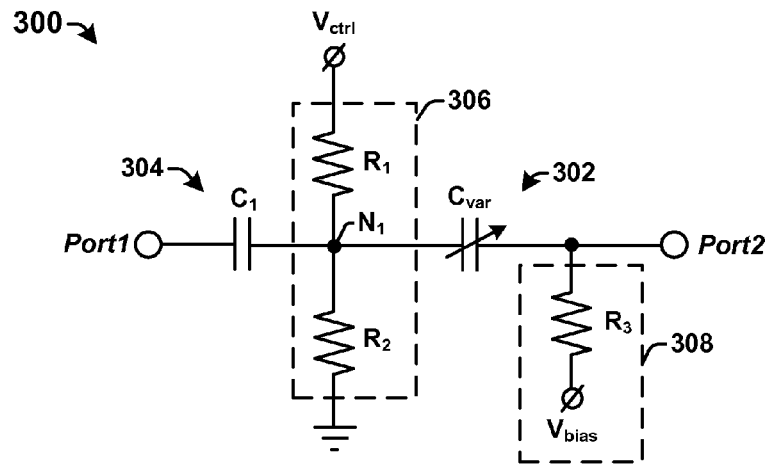
FIG. 3 illustrates some embodiments of a circuit diagram of a disclosed FinFET varactor circuit.

FIG. 3 illustrates some embodiments of a circuit diagram of a disclosed FinFET varactor circuit 300.

The FinFET varactor circuit 300 comprises a FinFET MOS varactor 302 having a variable capacitance. A voltage divider 306 is connected to the FinFET MOS varactor 302. In some embodiments, the voltage divider 306 is configured to reduce a voltage applied to the FinFET MOS varactor 302. By reducing the voltage applied to the FinFET MOS varactor 302, a resulting C-V curve of the FinFET MOS varactor 302 is smoothed, thereby reducing the impact of noise on the FinFET MOS varactor 302.

In some embodiments, the voltage divider 306 comprises a first resistive element $R_1$ and a second resistive element $R_2$. The first resistive element $R_1$ is connected between a control voltage $V_{ctrl}$ and a first node $N_1$. The first node $N_1$ is further coupled to the second resistive element $R_2$ and to the FinFET MOS varactor 302. The output of the voltage divider 306 is controlled by the control voltage $V_{ctrl}$, thereby allowing the voltage divider 306 to control (e.g., reduce) a voltage applied to the FinFET MOS varactor 302 and to smooth a relationship between an applied voltage provided to Port1 and Port2 and a resulting capacitance (i.e., to smooth a C-V relationship). In some embodiments, the first and second resistive elements, $R_1$ and $R_2$, may be selected to have relatively large values to prevent leakage current between the control voltage $V_{ctrl}$ and ground. For example, the first and second resistive elements, $R_1$ and $R_2$, may have resistances of between 1 kω and 10 kω. In some embodiments, the first and second resistive elements, $R_1$ and $R_2$, may comprise variable resistors having resistive values that may be changed over time.

A capacitive element 304 is connected in series with the Fin FET MOS varactor 302. By connecting the capacitive element 304 in series with the Fin FET MOS varactor 302, the rate of change (i.e., slope) between an applied voltage and a resulting capacitance and/or a ratio of $C_{max}/C_{min}$ can be tuned. In some embodiments, the capacitive element 304 may comprise a variable capacitor having a capacitance value that may be changed over time.

A DC bias voltage source 308 is connected to the Fin FET MOS varactor 302. Since the capacitance of a capacitor is a ratio of the charges on the capacitor's electrodes divided by the voltage between the electrodes, increasing the bias voltage applied the Fin FET MOS varactor 302 can increase or decrease the capacitance of the FinFET MOS varactor 302

(i.e., shift a C-V curve in X-axis). For example, operating the DC bias voltage source 308 to apply a bias voltage to the Fin FET MOS varactor 302 will increase the capacitance of the Fin FET MOS varactor 302. In some embodiments, the DC bias voltage source 308 is connected to the Fin FET MOS varactor 302 by way of a resistive element $R_3$. In some embodiments the resistive element $R_3$ may have a resistance of greater than 5 kn.

Figures 4A, 4B:
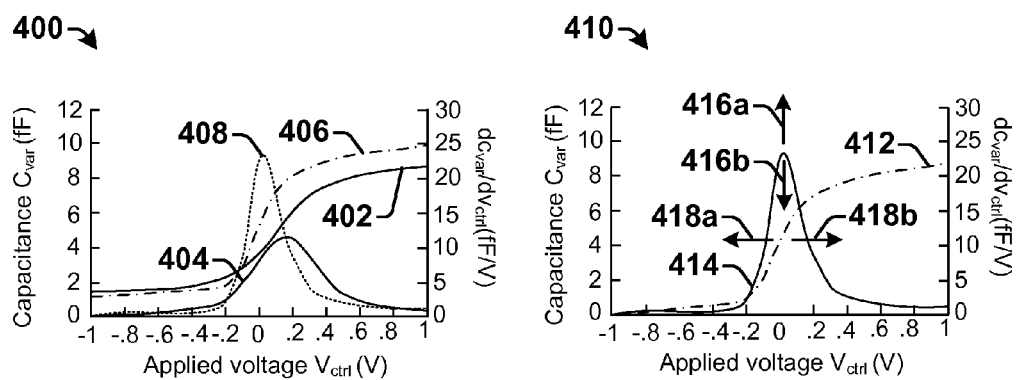
FIGS. 4A-4C illustrate some embodiments of graphs showing a relationship between a capacitance and an applied voltage of a disclosed FinFET varactor circuit.
Figure 4C:
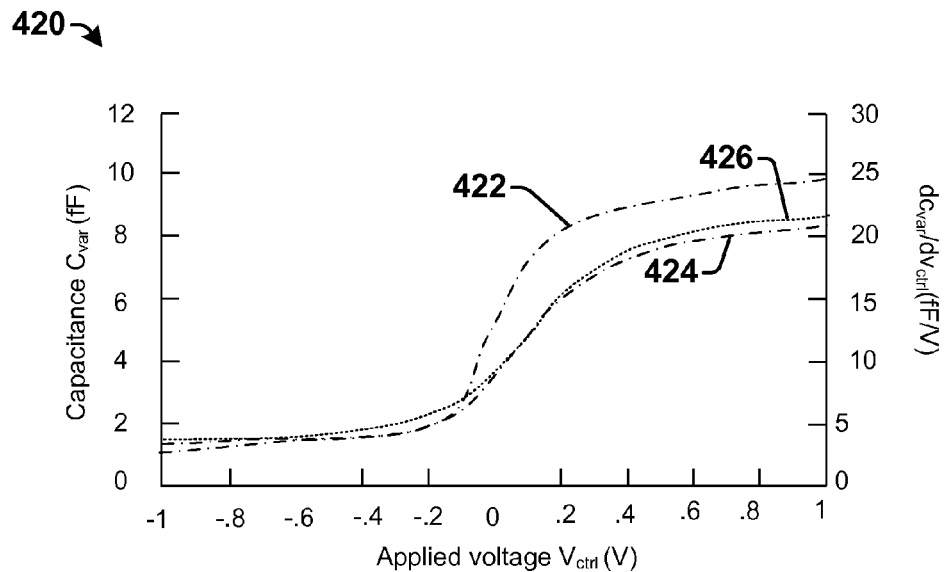

FIGS. 4A-4C illustrate some embodiments of graphs, 400, 410 and 420, showing a relationship between a capacitance and an applied voltage of a disclosed FinFET varactor circuit.

FIG. 4A illustrates some embodiments of a graph 400 of a C-V curve showing a relationship between an applied voltage and a varactor capacitance (i.e., a C-V curve) for a planar MOS varactor and for a disclosed Fin FET MOS varactor.

Trend line 402 shows a relationship between an applied voltage (shown on x-axis as $V_{ctrl}$) and a corresponding capacitance for a planar MOS varactor (shown on first y-axis as $C_{var}$). As shown by trend line 402, at a low applied voltage the capacitance of the planar MOS varactor has a minimum capacitance ($C_{min}$) of approximately 1 fF (femto-Farad). As the applied voltage increases, the capacitance will remain relatively constant until the applied voltage reaches approximately −0.2 V. From an applied voltage of approximately −0.2 V to approximately 4V, the capacitance of the planar MOS varactor will increase sharply until the capacitance of the planar MOS varactor reaches a value of between approximately 8 fF and approximately 9 fF. Eventually, at a large applied voltage the capacitance of the planar MOSFET varactor reaches a maximum capacitance ($C_{max}$) of approximately 9 fF. The ratio of $C_{max}/C_{min}$ achieved by the planar MOS varactor is approximately −6.0.

Trend line 404 illustrates a slope of trend line 402 (shown on second y-axis as $dc_{var}/dv_{ctrl}$). The slope is the change in capacitance as a function of the change in applied voltage for the planar MOSFET varactor. Trend line 404 shows that a slope of trend line 402 reaches a maximum of 12 at an applied voltage of between approximately 0.1 V and approximately 0.2 V.

Trend line 406 shows a relationship between an applied voltage value and a corresponding capacitance for a FinFET MOS varactor. As shown by trend line 406, at a low applied voltage the capacitance of the FinFET MOS varactor has a minimum capacitance ($C_{min}$) of approximately 1 fF. As the applied voltage increases, the capacitance will remain relatively constant until the applied voltage reaches approximately −0.15 V. From −0.2 V to approximately 3V, the capacitance of the FinFET MOS varactor will increase sharply until the capacitance of the FinFET MOS varactor reaches a value of between approximately 9 fF and approximately 10 fF. Eventually, at a large applied voltage the capacitance of the FinFET MOS varactor reaches a maximum capacitance ($C_{max}$) of approximately 10 fF. The ratio of $C_{max}/C_{min}$ achieved by the planar MOSFET device is approximately −8.8.

Trend line 408 illustrates a slope of trend line 406 as a function of the applied voltage for the FinFET MOS varactor. The slope of trend line 406 reaches a maximum of 24.9 at an applied voltage of between 0.1 and 0.2 V. Therefore, as illustrated in graph 400, the maximum slope of the FinFET MOS varactor is significantly higher than that of a planar MOS varactor (trend line 404) indicating that the FinFET MOS varactor is more susceptible to degraded performance due to noise.

FIG. 4B illustrates some embodiments of a graph 410 showing the C-V curve of a disclosed FinFET varactor circuit, in which the performance of a FinFET MOS varactor is varied using the one or more control elements. Although FIG. 4B illustrates some changes to the C-V curve of a disclosed FinFET varactor circuit, it will be appreciated that the changes to the C-V curve of the disclosed FinFET varactor circuit is not limited to the changes shown. Rather, other characteristics of the C-V curve of a disclosed FinFET varactor circuit may be adjusted by the one or more control elements.

Trend line 412 shows a relationship between an applied voltage value and a corresponding capacitance for a disclosed FinFET varactor circuit (along first y-axis). Trend line 414 illustrates a slope of trend line 412 (along second y-axis). The one or more control elements of the disclosed FinFET varactor circuit allow for trend line 412 and/or trend line 414 to be varied, as shown by arrows 416 and 418.

For example, a FinFET varactor circuit having a capacitive element connected in series (e.g., corresponding to 304) with the varactor allows for the maximum and minimum capacitances to be adjusted, thereby adjusting the tunability of the varactor circuit (trend line 414) according to arrows 416a and 416b. Similarly, a FinFET varactor circuit having a DC bias voltage source (e.g., corresponding to 308) allows for trend line 412 to be shifted along the x-axis according to arrows 418a and 418b.

FIG. 4C illustrates some embodiments of a graph 420 showing a C-V curve of the FinFET varactor circuit of FIG. 3 compared to a FinFET MOS varactor and a planar varactor. Trend line 422 illustrates a C-V curve of a FinFET MOS varactor. Trend line 424 illustrates a C-V curve of the FinFET varactor circuit (e.g., corresponding to the FinFET varactor circuit of FIG. 3). Trend line 426 illustrates a C-V curve of a planar MOS varactor.

Comparison of trend lines 422 and 424 shows a change in tunability induced by the series capacitive element, since the maximum capacitance of the disclosed FinFET varactor circuit (trend line 424) is smaller than that of the FinFET MOS varactor (trend line 422). Furthermore, the shift in the C-V curve caused by the DC bias voltage source can be seen since the C-V curve of the disclosed FinFET varactor circuit (trend line 424) is shifted to the right along the x-axis in comparison to the FinFET MOS varactor (trend line 422). By varying the operating characteristics of the disclosed FinFET varactor, trend line 424 of the disclosed FinFET varactor circuit can be altered to substantially match trend line 426 of the planar MOS varactor.

Figure 5:
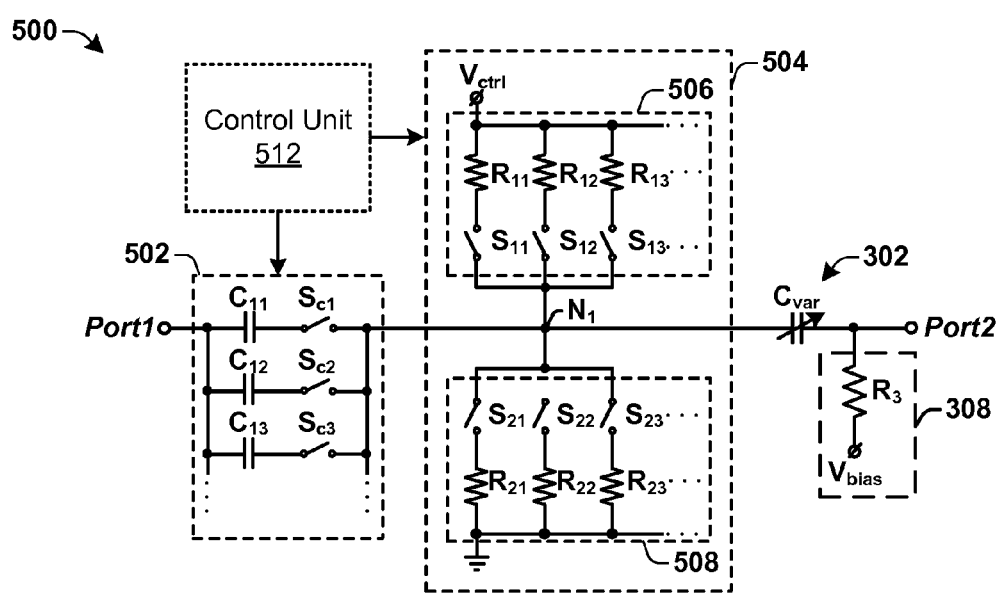
FIG. 5 illustrates some alternative embodiments of a circuit diagram of a disclosed FinFET varactor circuit.

FIG. 5 illustrates some alternative embodiments of a circuit diagram of a disclosed FinFET varactor circuit 500.

The FinFET varactor circuit 500 comprises a voltage divider 504 having a first resistive element 506 and a second resistive element 508 coupled to a first node $N_1$ electrically connected to FinFET MOS varactor 302. The first resistive element 506 comprises a switch-R network having a plurality of resistors $R_{11}$, $R_{12}$, and $R_{13}$. The plurality of resistors $R_{11}$, $R_{12}$, and $R_{13}$ are respectively coupled to the first node $N_1$ by a plurality of switches $S_{11}$, $S_{12}$, and $S_{13}$. Similarly, the second resistive element 508 comprises a switch-R network having a plurality of resistors $R_{21}$, $R_{22}$, and $R_{23}$ respectively coupled to the first node $N_1$ by a plurality of switches $S_{21}$, $S_{22}$, and $S_{23}$. In some embodiments, the plurality of switches $S_{11}$-$S_{13}$ and $S_{21}$-$S_{23}$ may comprise NMOS or PMOS transistor devices, or complementary switches.

The value of the first resistive element 506 and/or the second resistive element 508 may be varied by opening or closing one or more of the plurality of switches $S_{11}$, $S_{12}$, and $S_{13}$. For example, the first resistive element 506 can be operated to have a first resistance by opening switch $S_{11}$, and closing switches $S_{12}$ and $S_{13}$. Such a switching configuration places resistors $R_{12}$ and $R_{13}$ into parallel and provides for a resistance of $R_{12} \cdot R_{13}/(R_{12}+R_{13})$. To change the first resistive element 506 to have a second resistance, switch $S_{11}$ can be closed so that switches $S_{11}$-$S_{13}$ are closed. Such a switching configuration places resistors $R_{11}$, $R_{12}$, and $R_{13}$ into parallel and provides for a resistance of $R_{11} \cdot R_{12} \cdot R_{13}/(R_{11}+R_{12}+R_{13})$. By changing the resistive values of the first and second resistive elements, 506 and 508, the slope of the C-V curve of FinFET varactor circuit 500 can be changed.

The FinFET varactor circuit 500 further comprises a series capacitor 502 comprising a switch-C network having a plurality of capacitors $C_{11}$, $C_{12}$, and $C_{13}$. The plurality of capacitors $C_{11}$, $C_{12}$, and $C_{13}$ are respectively coupled to the first node $N_1$ by a plurality of switches $S_{c1}$, $S_{c2}$, and $S_{c3}$. The value of the series capacitor 502 may be varied by opening or closing one or more of the plurality of switches $S_{c1}$, $S_{c2}$, and $S_{c3}$. For example, the series capacitor 502 can be operated to have a first capacitance by opening switch $S_{c1}$, and closing switches $S_{c2}$ and $S_{c3}$. Such a switching configuration places capacitors $C_{12}$ and $C_{13}$ into parallel and provides for a capacitance of $C_{12} \cdot C_{13}/(C_{12}+C_{13})$. To change the series capacitor 502 to have a second capacitance, switch $S_{c1}$ can be closed so that switches $S_{c1}$-$S_{c3}$ are closed. Such a switching configuration places capacitors $C_{11}$, $C_{12}$, and $C_{13}$ into parallel and provides for a capacitance of $C_{11} \cdot C_{12} \cdot C_{13}/(C_{11}+C_{12}+C_{13})$. By changing the capacitive value of the series capacitor 502, the tuning ratio of the FinFET varactor circuit 500 can be changed.

In some embodiments, the FinFET varactor circuit 500 may comprise a control unit 512 configured to generate one or more control signals that are configured to control operation of the plurality of switches, $S_{11}$-$S_{13}$, $S_{21}$-$S_{23}$, and $S_{c1}$-$S_{c3}$. By operating the control unit 512 to control the operation of the plurality of switches, $S_{11}$-$S_{13}$, $S_{21}$-$S_{23}$, and $S_{c1}$-$S_{c3}$, a C-V curve of the FinFET varactor circuit 500 can be adjusted in real time.

In some embodiments, different components of a disclosed FinFET MOS varactor circuit may be disposed onto different die or tiers of a multi-dimensional integrated chip. In various embodiments, the multi-dimensional integrated chip may comprise a monolithic 3-dimensional (3D) integrated chip, a 2.5-dimensional integrated chip (2.5DIC) comprising a plurality of integrated chip die stacked on an interposer substrate, or a 3D integrated chip comprising a plurality of integrated chip die vertically stacked on top of one another.

Figure 6:
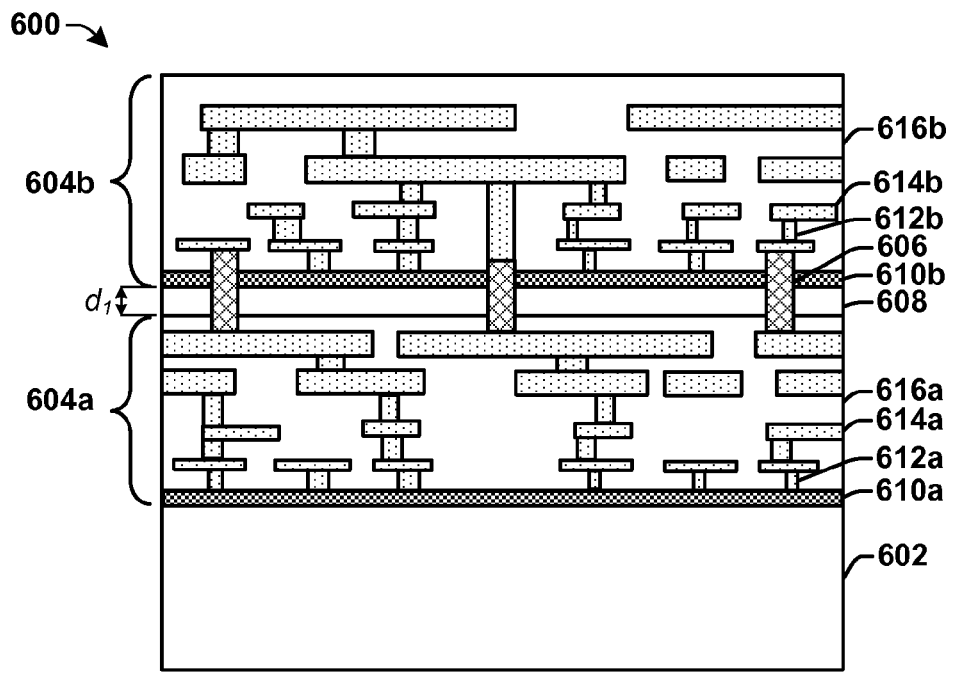
FIG. 6 illustrates some embodiments of a cross-sectional view of a three-dimensional integrated chip (3DIC) comprising a disclosed FinFET MOS varactor having different components disposed onto different tiers of the 3DIC.

For example, FIG. 6 illustrates some embodiments of a cross-sectional view of a 3D integrated chip (3DIC) 600 comprising a disclosed FinFET MOS varactor circuit having different components disposed onto different tiers of the 3DIC 600.

The 3DIC 600 comprises a plurality of tiers 604a-604b disposed over a semiconductor substrate 602. Respective tiers 604a-604b comprise a device layer 610 and a plurality of metal interconnect layers. The device layer 610 comprises one or more semiconductor devices (e.g., transistors) disposed within a semiconductor material (e.g., silicon). The plurality of metal interconnect layers comprises metal vias 612 and metal lines 614 disposed within one or more layers of dielectric material 616. In some embodiments, the 3DIC 600 may comprise a first tier 604a and a second tier 604b disposed over the first tier 604a. In other embodiments, the 3DIC 600 may comprise three or more tiers arranged over one-another in an analogous fashion.

The plurality of tiers 604a-604b are separated from one-another by an electrically isolating layer 608 (e.g., silicon dioxide) and are electrically interconnected by way of one or more inter-tier vias (ITVs) 606. In some embodiments, the electrically isolating layer 608 may have a thickness in a range of between approximately 1 um and approximately 5 um. In some embodiments, the ITVs 606 may be the same size as metal vias 612 within the plurality of metal interconnect layers. For example, in some embodiments the ITVs 606 may have a diameter in a range of between approximately 50 nm and approximately 300 nm.

Different components of a disclosed FinFET MOS varactor circuit may be disposed onto different ones of plurality of tiers 604a-604b. For example, in some embodiments a FinFET MOS varactor (e.g., corresponding to 302) may be disposed within device layer 610a of the first tier 604a, while a switch-C network (e.g., corresponding to 502) and/or a switch-R network (e.g., corresponding to 506 and/or 508) may be disposed within device layer 610b of the second tier 604b. In such embodiments, the FinFET MOS varactor can be electrically connected to the switch-C network and/or a switch-R network by way of one or more ITVs 606.

Figure 7:
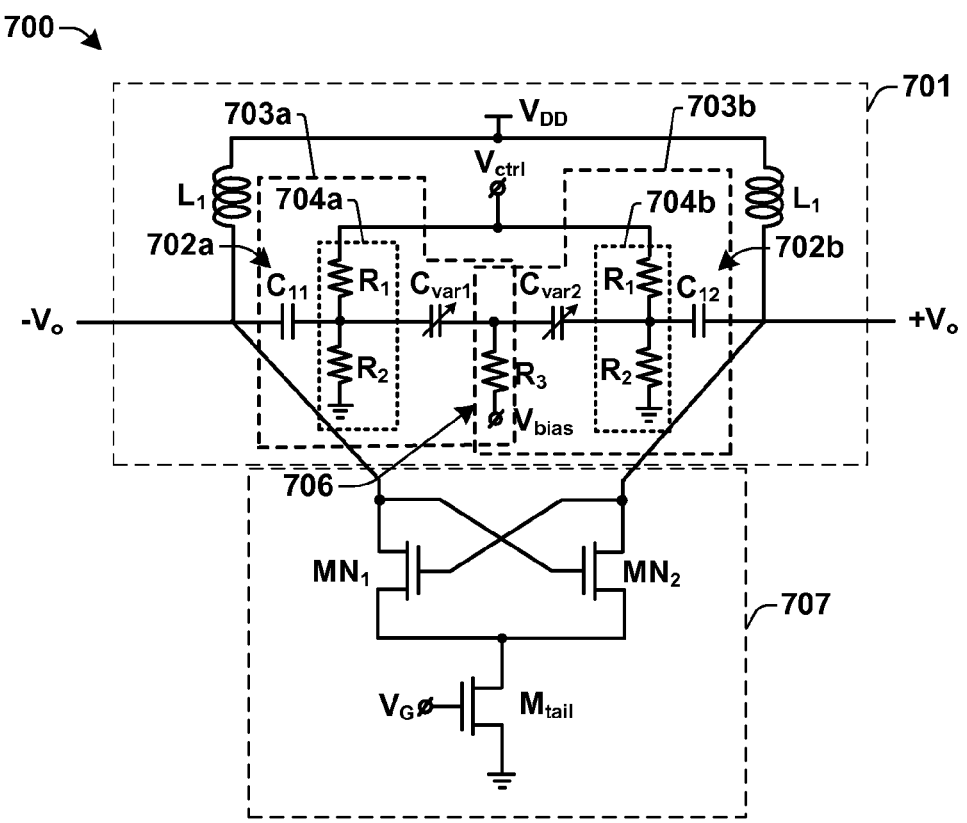
FIG. 7 illustrates some embodiments of a circuit diagram of a voltage controlled oscillator (VCO) comprising a disclosed FinFET varactor circuit.

FIG. 7 illustrates some embodiments of a circuit diagram of a voltage controlled oscillator (VCO) 700 comprising disclosed FinFET varactor circuits $C_{var}$.

The VCO 700 comprises an LC tank circuit 701 coupled to a drive circuit 707. The LC tank circuit 701 comprises first and second inductive components, $L_1$ and $L_2$ (e.g., center-tap inductors). The first and second inductive components, $L_1$ and $L_2$, are respectively coupled to a supply voltage $V_{DD}$ and to a first FinFET varactor circuit 703a and a second FinFET varactor circuit 703b. The first FinFET varactor circuit 703a comprises a FinFET MOS varactor $C_{var1}$, a capacitor $C_{11}$, a voltage divider 704a, and a DC bias voltage source 706. The second FinFET varactor circuit 703b comprises a FinFET MOS varactor $C_{var2}$, a capacitor $C_{12}$, a voltage divider 704b, and the DC bias voltage source 706. The first FinFET varactor circuit 703a and the first inductive component $L_1$ form a first LC resonator and the second FinFET varactor circuit 703b and the second inductive component $L_2$ form a second LC resonator.

The drive circuit 707 comprises a "positive feedback network" and a tail current source. The positive feedback network comprises cross-coupled first and second transistors, $MN_1$ and $MN_2$. The first transistor $MN_1$ comprises a drain connected to the first inductive component $L_1$, a source connected to a ground terminal via a tail transistor $M_{tail}$, and a gate connected to a drain of the second transistor $MN_2$. The second transistor $MN_2$ comprises a drain connected to the second inductive component $L_2$, a source connected to a ground terminal via the tail transistor $M_{tail}$, and a gate connected to a drain of the first transistor $MN_1$. A bias voltage, $V_G$, is configured to operate the tail transistor $M_{tail}$ to provide a current to the first and second transistors.

During operation, the LC tank circuit 701 resonates, causing the VCO 700 to generate a first output $-V_o$ and a differential, second output $+V_o$ at its resonant frequency. The cross-coupled transistors, $MN_1$ and $MN_2$, of the drive circuit 707 provide a negative resistance that sustains oscillation by compensating loss in the LC tank circuit 701. For example, the negative resistance of the drive circuit 707 offsets a positive resistance of the LC tank circuit 701 so as to cancel out losses of LC tank circuit 701. As the LC tank circuit 701 oscillates, the current flow may originate from the tail transistor $M_{tail}$ and then alternately pass through the cross-coupled transistors $MN_1$ and $MN_2$, which switch between conductive and non-conductive states in coordination with the oscillations of the LC tank circuit 701, thereby reinforcing the oscillations of the LC tank circuit 701.

The first and second outputs, $-V_o$ and $+V_o$, have a frequency that is controlled by the LC tank circuit 701 and that is inversely proportional to the square of the capacitance provided by the first and second FinFET varactor circuits, 703a and 703b. Therefore, the first FinFET varactor circuit 703a and the second FinFET varactor circuit 703b can tune the VCO 700 over a wide range of frequencies (e.g., RF frequencies) through use of the first and second voltage dividers, 704a and 704b, the first and second capacitive elements, 702a and 702b, or the DC bias voltage source 706.

Figure 8:
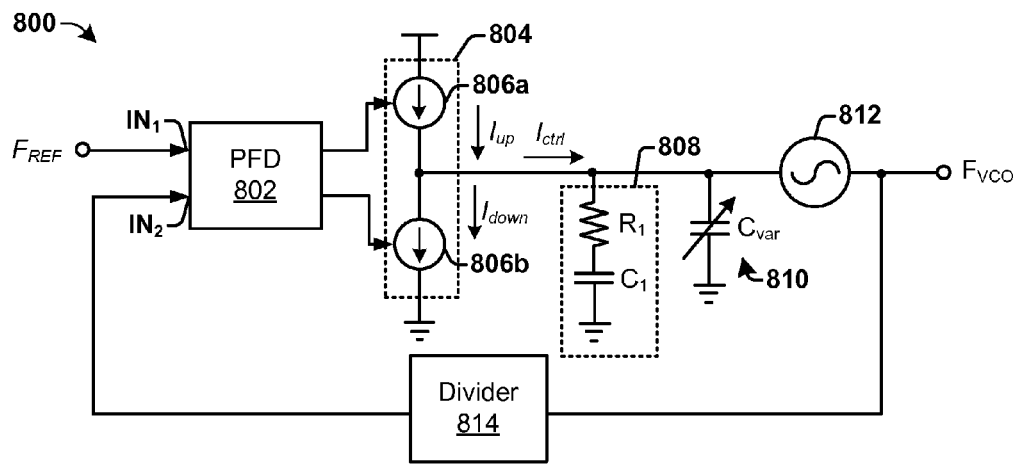
FIG. 8 illustrates some embodiments of a circuit diagram of a PLL (phase locked loop) comprising a disclosed FinFET varactor circuit.

FIG. 8 illustrates some embodiments of a circuit diagram of a phase locked loop PLL 800 (phase locked loop) comprising a VCO (corresponding to VCO 700) comprising a disclosed FinFET varactor.

Phase locked loop 800 comprises a phase frequency detector 802 (PFD) having a first input node $IN_1$ configured to receive an external reference clock signal $F_{REF}$ and a second input node $IN_2$ configured to receive a divided feedback clock signal from a divider circuit 814. The phase frequency detector 802 is configured to measure the phase and frequency difference between the external reference clock signal $F_{REF}$ and the divided feedback clock signal and based thereupon to output phase difference signals that are provided to a charge pump 804.

The charge pump 804 comprises a first current source 806a and a second current source 806b. The first current source 806a is configured to receive a first one of the phase difference signals and based thereupon to generate a current $I_{up}$. The second current source 806b is configured to receive a second one of the phase difference signals and based thereupon to generate a current $I_{down}$. Currents $I_{up}$ and $I_{down}$ add together to form a control current $I_{ctrl}$ that is proportional to a phase difference detected by the phase frequency detector 802. The control current $I_{ctrl}$ is output of the charge pump 804 to a filter 808.

A varactor 810 is connected between an output of the filter 808 and a voltage controlled oscillator 812 (VCO) comprising the disclosed FinFET varactor circuit. The frequency of a VCO 812 is adjusted by altering a capacitance value input to the VCO so as to align clock edges of the divided clock signal with the external reference clock. In a locked stage the current $I_{up}$ output from the first current source is different than the current $I_{down}$ output from the second current source to provide a control current $I_{ctrl}$, having a non-zero value that is equal to $I_{up}$-$I_{down}$, to the voltage control node of the VCO. The difference between $I_{up}$ and $I_{down}$ is configured to account for the additional resistance of the disclosed voltage divider used in the VCO 812. The VCO is configured to receive the control current $I_{ctrl}$, and based thereupon to vary a frequency of the VCO 812.

Figure 9:
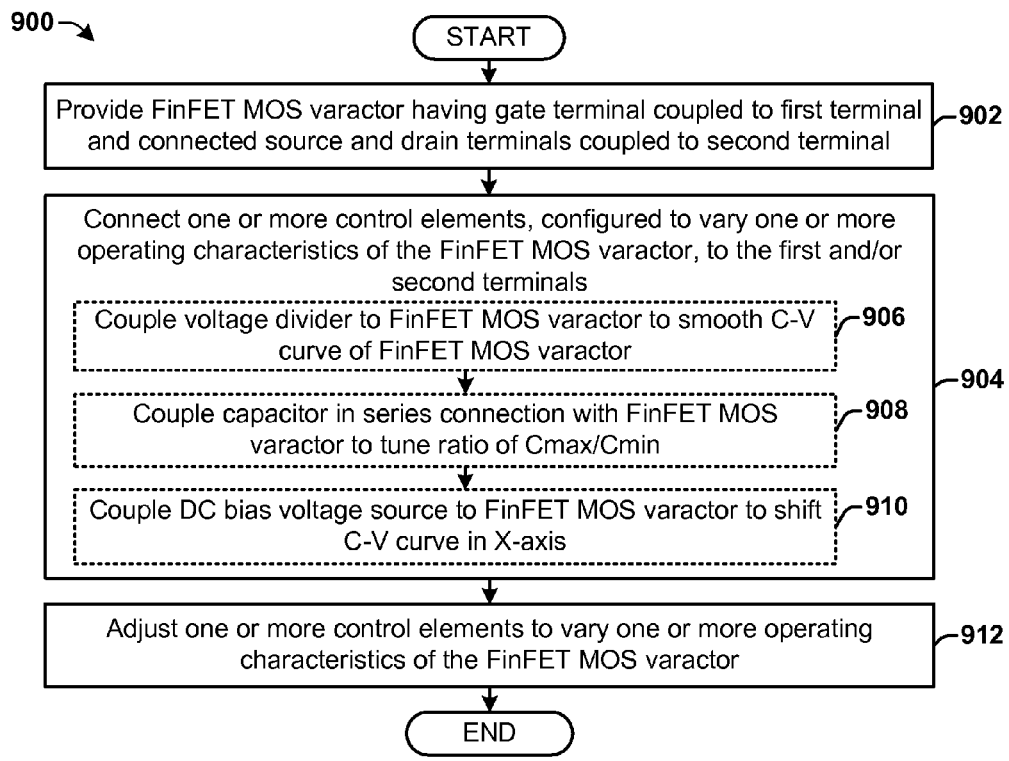
FIG. 9 is a flow diagram of some embodiments of a method of forming a FinFET varactor circuit having one or more control elements configured to adjust a relationship between an applied voltage and a capacitance.

FIG. 9 is a flow diagram of some embodiments of a method of forming a FinFET varactor circuit having a variable relationship between capacitance and voltage.

While method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902, a FinFET MOS varactor is provided. The FinFET MOS varactor comprises a first terminal comprising a gate of a FinFET transistor device and a second terminal comprising connected source and drain terminals of the FinFET transistor device.

At 904, one or more control elements are connected to the first terminal and/or the second terminal of the FinFET MOS varactor. The one or more control elements are configured to vary one or more operating characteristics of the FinFET MOS varactor. For example, the one or more control elements may vary a capacitance of the FinFET MOS varactor and/or a relationship between a voltage applied to the FinFET MOS varactor and a resulting capacitance In some embodiments, the one or more control elements may comprise a voltage divider. In such embodiments, the voltage divider may be coupled to the FinFET MOS varactor to smooth a C-V curve of the FinFET MOS varactor, at 906.

In some embodiments, the one or more control elements may comprise a capacitive element. In such embodiments, the capacitive element may be coupled in a series connection with the FinFET MOS varactor to tune a ratio of the highest and lowest capacitive values ($C_{max}/C_{min}$) achievable over a range of applied voltages, at 908.

In some embodiments, the one or more control elements may comprise a DC bias voltage source. In such embodiments, the DC bias voltage source may be coupled to the FinFET MOS varactor to shift C-V curve in X-axis, at 910.

In some embodiments, one or more of the one or more control elements may be adjusted to vary one or more operating characteristics of the FinFET MOS varactor, at 912. For example, in some embodiments a capacitive value of the series capacitor, a value of a resistive element within the voltage divider, and/or a value of a bias voltage provided by the bias voltage source may be varied.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a FinFET varactor circuit having one or more control elements configured to control a relationship between a capacitance and a voltage of a FinFET MOS varactor without introducing changes to process parameters used in fabrication of the FinFET MOS varactor, and a method of formation.

In some embodiments, the present disclosure relates to a FinFET varactor circuit. The FinFET varactor circuit comprises a FinFET (field effect transistor) MOS varactor having a first terminal comprising a gate terminal of the FinFET MOS varactor and a second terminal comprising connected source and drain terminals of the FinFET MOS varactor. The FinFET varactor circuit further comprises one or more control elements connected to the first terminal or the second terminal of the FinFET MOS varactor and configured to vary one or more operating characteristics of the FinFET MOS varactor when a voltage is applied to the one or more control elements.

In other embodiments, the present disclosure relates to a FinFET varactor circuit. The FinFET varactor circuit comprises a FinFET (field effect transistor) MOS varactor having a first terminal comprising a gate terminal of the FinFET MOS varactor and a second terminal comprising connected source and drain terminals of the FinFET MOS varactor. A voltage divider having a first resistive element is connected between a control voltage and a first node that is further coupled to a second resistive element and to the FinFET MOS varactor. A capacitive element is connected in series with the FinFET MOS varactor at the first node and a DC bias voltage source is coupled to the FinFET MOS varactor and is configured to selectively apply a DC bias voltage to the FinFET MOS varactor In yet other embodiments, the present disclosure relates to a method of forming a FinFET varactor circuit. The method comprises providing a FinFET (field effect transistor) MOS varactor having a first terminal comprising a gate terminal of the FinFET MOS varactor and a second terminal comprising connected source and drain terminals of the FinFET MOS varactor. The method further comprises connecting one or more control elements to the first or second terminals of the FinFET MOS varactor, wherein the one or more control elements are configured to vary one or more operating characteristics of the FinFET MOS varactor.

What is claimed is:

1. A FinFET varactor circuit, comprising:
    a FinFET (field effect transistor) MOS varactor having a first terminal comprising a gate terminal of the FinFET MOS varactor connected to a first node and a second terminal comprising connected source and drain terminals of the FinFET MOS varactor; and
    one or more control elements connected to the first terminal or the second terminal of the FinFET MOS varactor and configured to vary one or more operating characteristics of the FinFET MOS varactor when a voltage is applied to the one or more control elements.

2. The FinFET varactor circuit of claim 1, further comprising:
    a control unit configured to generate one or more control signals that are configured to adjust operation of the one or more control elements over time.

3. The FinFET varactor circuit of claim 1, wherein the one or more control elements comprise a voltage divider having a first resistive element connected between a control voltage and the first node, which is further coupled to a second resistive element and to the FinFET MOS varactor.

4. The FinFET varactor circuit of claim 3,
    wherein the first resistive element comprises a first switch-R network having a first plurality of resistors respectively coupled to the first node by a first plurality of switches; and
    wherein the second resistive element comprises a second switch-R network having a second plurality of resistors respectively coupled to the first node by a second plurality of switches.

5. The FinFET varactor circuit of claim 4, wherein the first plurality of switches and the second plurality of switches comprise transistor devices.

6. The FinFET varactor circuit of claim 1, wherein the one or more control elements comprise a capacitive element connected in series with the FinFET MOS varactor at the first node.

7. The FinFET varactor circuit of claim 6, wherein the capacitive element comprises a switch-C network having a plurality of capacitors respectively coupled to the first node by a plurality of switches.

8. The FinFET varactor circuit of claim 1, wherein the one or more control elements comprise a DC bias voltage source coupled to the FinFET MOS varactor and configured to selectively apply a DC bias voltage to the FinFET MOS varactor.

9. The FinFET varactor circuit of claim 1, wherein one or more of the control elements are disposed on separate tiers of a three-dimensional integrated chip (3DIC).

10. A FinFET varactor circuit, comprising:
    a FinFET (field effect transistor) MOS varactor having a first terminal comprising a gate terminal of the FinFET MOS varactor connected to a first node and a second terminal comprising connected source and drain terminals of the FinFET MOS varactor; and
    a voltage divider having a first resistive element connected between a control voltage and the first node that is further coupled to a second resistive element and to the FinFET MOS varactor;
    a capacitive element connected in series with the FinFET MOS varactor at the first node; and
    a DC bias voltage source coupled to the second terminal of the FinFET MOS varactor and configured to selectively apply a DC bias voltage to the FinFET MOS varactor.

11. The FinFET varactor circuit of claim 10, further comprising
    a control unit configured to generate one or more control signals that are configured to adjust operation of the voltage divider, the capacitive element, or the DC bias voltage source over time.

12. The FinFET varactor circuit of claim 10,
    wherein the first resistive element comprises a first switch-R network having a first plurality of resistors respectively coupled to the first node by a first plurality of switches; and
    wherein the second resistive element comprises a second switch-R network having a second plurality of resistors respectively coupled to the first node by a second plurality of switches.

13. The FinFET varactor circuit of claim 10, wherein one or more of the voltage divider, the capacitive element, and the DC bias voltage source are disposed on separate tiers of a three-dimensional integrated chip (3DIC).

14. A method of forming a FinFET varactor circuit, comprising:
    providing a FinFET (field effect transistor) MOS varactor having a first terminal comprising a gate terminal of the FinFET MOS varactor connected to a first node and a second terminal comprising connected source and drain terminals of the FinFET MOS varactor; and
    connecting one or more control elements to the first or second terminals of the FinFET MOS varactor, wherein the one or more control elements are configured to vary one or more operating characteristics of the FinFET MOS varactor.

15. The method of claim 14, wherein the one or more control elements comprise a voltage divider having a first resistive element connected between a control voltage and the first node that is further coupled to a second resistive element and to the FinFET MOS varactor.

16. The method of claim 14, wherein the one or more control elements comprise a capacitive element connected in series with the FinFET MOS varactor at the first node.

17. The method of claim 14, wherein the one or more control elements comprises a DC bias voltage source coupled to the second terminal of the FinFET MOS varactor and configured to selectively apply a DC bias voltage to the FinFET MOS varactor.

18. The FinFET varactor circuit of claim 1, wherein the first terminal is connected directly to the first node.

19. The FinFET varactor circuit of claim 7,
wherein the plurality of capacitors respectively comprise a first terminal connected directly to an input node and a second terminal connected to one of the plurality of switches; and
wherein the plurality of switches respectively comprise a first terminal connected to one of the plurality of capacitors and a second terminal connected directly to the first node.

20. The FinFET varactor circuit of claim 8, wherein the second terminal of the FinFET (field effect transistor) MOS varactor is connected directly to the DC bias voltage source and an output node.

* * * * *